US011435399B2

(12) United States Patent
Sternberg et al.

(10) Patent No.: US 11,435,399 B2
(45) Date of Patent: Sep. 6, 2022

(54) EFFICIENT LASER-INDUCED SINGLE-EVENT LATCHUP AND METHODS OF OPERATION

(71) Applicant: VANDERBILT UNIVERSITY, Nashville, TN (US)

(72) Inventors: Andrew L. Sternberg, Nashville, TN (US); Ronald D. Schrimpf, Nashville, TN (US); Robert A. Reed, Nashville, TN (US)

(73) Assignee: Vanderbilt University, Nashville, TN (US)

( * ) Notice: Subject to any disclaimer, the term of this patent is extended or adjusted under 35 U.S.C. 154(b) by 515 days.

(21) Appl. No.: 16/481,773

(22) PCT Filed: Feb. 8, 2018

(86) PCT No.: PCT/US2018/017377
§ 371 (c)(1),
(2) Date: Jul. 29, 2019

(87) PCT Pub. No.: WO2018/148377
PCT Pub. Date: Aug. 16, 2018

(65) Prior Publication Data
US 2019/0391203 A1    Dec. 26, 2019

Related U.S. Application Data

(60) Provisional application No. 62/456,525, filed on Feb. 8, 2017.

(51) Int. Cl.
*G01R 31/311* (2006.01)
*G01R 31/265* (2006.01)

(52) U.S. Cl.
CPC ........ *G01R 31/311* (2013.01); *G01R 31/2656* (2013.01)

(58) Field of Classification Search
CPC .... H02H 3/087; H02H 3/05; G01R 31/31816; G01R 31/311; G01R 31/2656; G01R 31/305
See application file for complete search history.

(56) References Cited

U.S. PATENT DOCUMENTS 4,410,238 A * 10/1983 Hanson .................... G02F 1/31
                                                          349/196
5,493,236 A *  2/1996 Ishii .................... G01R 31/2656
                                                          324/501
(Continued)

FOREIGN PATENT DOCUMENTS

WO       WO-9904311 A1 *  1/1999  ............... G02F 1/31

OTHER PUBLICATIONS

B. Alpat et al., "A pulsed nanosecond IR laser diode system to automatically test the Single Event Effects in the laboratory," Nuclear Instruments and Methods in Physics Research A 485 (2002) 183-187, doi: 10.1016/S0168-9002(02)00552-1 (Year: 2002).*

(Continued)

*Primary Examiner* — Yoshihisa Ishizuka
*Assistant Examiner* — Christopher J Gassen
(74) *Attorney, Agent, or Firm* — Nixon Peabody LLP (57) ABSTRACT

Systems and methods are provided for testing a threshold energy required to cause a latchup on an electronic component. An exemplary method includes applying a series of laser pulses to a testing object with a pulsed laser unit. The testing object is connected to a testing circuit which can measure the energy of each of the series of laser pulses, and detect whether a pulse of the series of laser pulses resulted in a latchup on the testing object. Upon detecting the pulse, the method provides for logging the energy of the pulse using a recording unit and logging the latchup status of the (Continued)

test device. If a latchup is detected, the testing circuit automatically mitigates the latchup event.

12 Claims, 9 Drawing Sheets

(56) References Cited

U.S. PATENT DOCUMENTS

| | | | | |
|---|---|---|---|---|
| 6,633,173 | B1* | 10/2003 | Orban | G01R 31/311 |
| | | | | 324/754.23 |
| 7,492,560 | B2* | 2/2009 | Hussein | H01L 27/0921 |
| | | | | 361/91.1 |
| 7,830,165 | B2* | 11/2010 | Chu | G01R 31/2881 |
| | | | | 324/754.23 |
| 9,297,852 | B2* | 3/2016 | Dunnihoo | G01R 31/002 |
| 9,392,944 | B2* | 7/2016 | Kasamatsu | H01S 3/1062 |
| 9,823,679 | B2* | 11/2017 | Wilberg | H02H 3/093 |
| 9,960,593 | B2* | 5/2018 | Vail | H02H 3/087 |
| 2003/0001597 | A1* | 1/2003 | Juhn | G01R 31/002 |
| | | | | 324/750.3 |
| 2013/0099774 | A1* | 4/2013 | Miller | G01R 31/2848 |
| | | | | 324/97 |
| 2016/0011523 | A1* | 1/2016 | Singh | G01J 3/45 |
| | | | | 355/77 |
| 2016/0097984 | A1* | 4/2016 | Singh | G03F 9/7026 |
| | | | | 250/372 |
| 2017/0033554 | A1 | 2/2017 | Vail | |

OTHER PUBLICATIONS

N. Buard, F. Miller, C. Ruby and R. Gaillard, "Latchup effect in CMOS IC: a solution for crypto-processors protection against fault injection attacks?," 13th IEEE International On-Line Testing Symposium (IOLTS 2007), 2007, pp. 63-70, doi: 10.1109/IOLTS.2007. 42. (Year: 2007).*

D. Mcmorrow et al., "Laser-Induced Latchup Screening and Mitigation in CMOS Devices," in IEEE Transactions on Nuclear Science, vol. 53, No. 4, pp. 1819-1824, Aug. 2006, doi: 10.1109/TNS. 2006.880929. (Year: 2006).*

S. P. Buchner, F. Miller, V. Pougetand D. P. McMorrow, "Pulsed-Laser Testing for Single-Event Effects Investigations," in IEEE Transactions on Nuclear Science, vol. 60, No. 3, pp. 1852-1875, Jun. 2013, doi: 10.1109/TNS.2013.2255312. (Year: 2013).*

J. R. Schwank et al., "Estimation of Heavy-Ion LET Thresholds in Advanced SOI IC Technologies From Two-Photon Absorption Laser Measurements," in IEEE Transactions on Nuclear Science, vol. 57, No. 4, pp. 1827-1834, Aug. 2010, doi: 10.1109/TNS.2010. 2040754. (Year: 2010).*

A. J. Burnell, A. M. Chugg and R. Harboe-Srensen, "Laser SEL Sensitivity Mapping of SRAM Cells," in IEEE Transactions on Nuclear Science, vol. 57, No. 4, pp. 1973-1977, Aug. 2010, doi: 10.1109/TNS.2009.2039146. (Year: 2010).*

N. A. Dodds et al., "SEL-Sensitive Area Mapping and the Effects of Reflection and Diffraction From Metal Lines on Laser SEE Testing," in IEEE Transactions on Nuclear Science, vol. 60, No. 4, pp. 2550-2558, Aug. 2013, doi: 10.1109/TNS.2013.2246189. (Year: 2013).*

Alpat, B. et al., "A pulsed nanosecond IR laser diode system to automatically test the Single Event Effects in the Laboratory," Nuclear Instruments & Methods in Physics Research, Section A, 485(1-2): 183-187, Jun. 1, 2002.

McMorrow, D. et al., "Laser-Induced Latchup Screening and Mitigation in CMOS Devices," Radiation and its Effects on Components and System, IEEE 8th European Conference, pp. C22-1, Sep. 1, 2005.

Buard, N. et al., "Lathup effect in CMOS IC: a soultion for crypto-processors protection against fault injection attackes?", On-Line Testing Symposium, 13th IEEE Internatioal, pp. 63-70, Jul. 1, 2007.

Extended European Search Report in European Patent Application No. EP 18751749.5, dated Nov. 30, 2011 (6 pages).

International Search Report for International Application No. PCT/US2018/017377, dated Apr. 26, 2018 (2 pages).

Written Opinion of International Searching Authority for International Application No. PCT/US2018/017377, dated Apr. 26, 2018 (6 pages).

Schwank, J. et al.; "Estimation of Heavy-Ion LET Thresholds in Advanced SOI IC Technologies From Two-Photon Absorption Laser Measurements"; IEEE Transactions on Nuclear Science, vol. 57, No. 4, pp. 1827-1834; Aug. 2010 (8 pages).

Buchner, S. et al.; "Pulsed-Laser Testing for Single-Event Effects Investigations"; IEEE Transactions on Nuclear Science, vol. 60, No. 3, pp. 1852-1875; Jun. 2013 (24 pages).

Burnell, A. et al.; "Laser SEL Sensitivity Mapping of SRAM Cells"; IEEE Transactions on Nuclear Science, vol. 57, No. 4, pp. 1973-1977; Aug. 2010 (5 pages).

Dodds, N. A. et al.; "SEL-Sensitive Area Mapping and the Effets of Reflection and Diffraction From Metal Lines on Laser SEE Testing"; IEEE Transactions on Nuclear Science, vol. 60, No. 4, pp. 2550-2558; Aug. 2013 (9 pages).

Wang, P. et al.; "Analysis of TPA Pulsed-Laser-Induced Single-Event Latchup Sensittive-Area"; IEEE Transactions on Nuclear Science, vol. 65, No. 2, pp. 502-509; Jan. 2018 (8 pages).

* cited by examiner

EFFICIENT LASER-INDUCED SINGLE-EVENT LATCHUP AND METHODS OF OPERATION

CROSS-REFERENCE TO RELATED APPLICATIONS

This application is a National Phase of International Application No.: PCT/US2018/017377, filed Feb. 8, 2018, which claims priority to and the benefit of U.S. Provisional Application Ser. No. 62/456,525, filed Feb. 8, 2017, the contents of which are hereby incorporated by reference in their entirety as if fully set forth herein.

FIELD OF THE INVENTION

The present invention relates to testing single-event latchup, and more specifically to systems and methods for testing electronic parts to determine a threshold energy for single-event latchup.

BACKGROUND

The natural radiation environment of space is well-known to have deleterious effects on electronic components. Total-ionizing dosages received primarily from high-energy protons and electrons and bremsstrahlung x-rays may cause a gradual degradation of device performance, leading to eventual failures. Energetic ions emanating from the sun or from galactic sources may cause more immediate effects, known as single-event effects (SEE). These may appear as transients in analog or digital circuits. Heavy-ions may also cause bit-flips in sequential logic and memory cells, leading to effects such as data corruption or incorrect state machines.

Another class of potentially destructive events exists. This class includes burnout and breakdown in power devices and single-event latchup (SEL). SEL frequently produces a low-resistance path for current to flow, causing excessive heating which can damage metallization, semiconductors, bond wires, and traces. SEL is a positive feedback event and will be sustained until power is removed from the device under test.

While the transient and bit-flip events may cause corruption or interrupt functionality, they are potentially recoverable using techniques such as scrubbing, reprogramming, or simply rebooting. In contrast, SEL, as the name implies, is a latchup event which may lead to sustained high-current that can cause localized heating, possibly damaging junctions, melting metallization, or burning out bond wires.

Techniques exist for detecting and mitigating SEL. However, latent damage may shorten the lifetime of the part or impair performance. Mitigation techniques may also add complexity to the system, making failure analysis more difficult. It is important to understand the frequency and nature of these latchup events to best design mitigation techniques.

The traditional method for measuring SEL involves exposing the part under normal or worst-case operating conditions to heavy-ion or proton beams at an accelerator facility. These facilities may be very expensive, but permit the user to measure the number of latchup events for ions of different linear-energy transfer (LET) at a specified flux. This information can be convolved with the spectrum of heavy ions present at a particular orbit and solar environment to estimate the rate at which SEL will occur. If the SEL rate is below the acceptable risk for the mission, then no changes are needed.

If corrective actions are required, one may choose to use SEL detection circuitry, or replace the part with one having better SEL performance. Radiation-hardened parts, when they exist, are often very expensive, leaving designers to search for commercial replacement parts which may have lower SEL cross-sections, higher SEL thresholds, or even be SEL immune.

There are several databases which maintain radiation performance data on a variety of parts. In addition, radiation test results may also be found in a number of publications. Unfortunately, these databases only cover a small fraction of all the electronic components available today.

SEL can be very sensitive to the device fabrication process. Given that many vendors operate multiple fabrication facilities, or outsource part or even all of their fabrication to third parties, it is frequently the case that older radiation data are no longer applicable to recently purchased parts. For low-volume customers, it may be nearly impossible to purchase all their parts from a known lot or wafer run. Thus, if designers want to know the SEL sensitivity of a particular part, they must have either some knowledge of the fabrication process or test data.

Lower volume customers can try to use pulsed lasers to trigger SEL in a manner similar to heavy ions. This can provide useful information over heavy ions because a pulsed laser allows control over the location and time of the strike, whereas these values are not controllable with heavy ion sources.

To test for SEL, the supply currents for the device must be monitored during the test and the power removed when SEL is detected. This is frequently accomplished by continuously polling a power supply and sending shutoff commands when a threshold current is reached. This process can take 10s to 100s of milliseconds. Two problems arise from this time lag. The first is that significant heating can take place during this time. The second is that the pulsed lasers typically used operate at a frequency of 1000 Hz. This means that many laser events may take place while the device is being reset. As a result, it may be difficult to determine which pulse caused the SEL.

What is needed is a method to detect a SEL, break the current path initiated in the testing object by the SEL, and reset the circuit quickly so that the circuit is undamaged and continues to operate as intended. Further, in order to test electronic parts before wide-scale production, a method is needed to create isolated SELs on an integrated circuit, determine what energy of a laser pulse caused the SEL, turn off the current, and restart the device before damage occurs.

SUMMARY

The various examples of the present disclosure are directed towards a method for detecting latchup events while testing electronic parts to determine a threshold energy for SEL. In a first example, the method comprises applying, via a pulsed laser unit, a series of laser pulses to a testing object which is connected to a testing circuit. The method includes measuring an energy of each of the series of laser pulses and recording a latchup status. During the application of each pulse of the series of laser pulses, the method provides for detecting whether the pulse resulted in a latchup on the testing object. The method can detect the latchup on the testing object via a detection unit of the testing circuit. Upon detecting the latchup, a current path of the testing object is automatically removed so that the testing object has no current across it. After a pre-determined period of time, the detection unit can restart operation of the testing object.

In a second example, a system is provided for which can detect latchup. The system comprises a testing object, a pulsed laser unit, a testing circuit, a detection unit, and a recording unit. The pulsed laser unit can be configured to apply a series of laser pulses to the testing object with the testing circuit. The testing circuit can measure energy of each of the series of laser pulses and record a latchup status. The testing circuit can also include both the detection unit and the recording unit. The detection unit is coupled to the testing circuit and configured to evaluate each pulse of the series of laser pulses to determine whether the pulse resulted in a latchup on the testing object. The recording unit can log the energy of every pulse. After the recording unit logs the energy of a pulse causing a latchup, the testing circuit is configured to automatically remove a current path of the testing object. The testing circuit can restart operation of the testing object after a pre-determined period of time.

In another example, a filtering unit is applied to the pulsed laser unit to continuously vary energy from the pulsed laser unit. In some implementations, the filtering unit is configured to be a neutral density filter wheel on a motorized mount which rotates continuously to allow for a different energy of the pulsed laser unit every millisecond.

In another example, the detection unit is configured to be a circuit connected in series with the testing object. This detection unit can measure both analog and digital signals to determine whether a latchup has occurred. In some implementations, the detection unit and the recording unit are combined to be a single detection and recording unit.

In another example, the pre-determined period of time before restarting operation of the pulsed laser unit can be a period of time long enough to allow for the testing object to return to a neutral state after receiving elevated amounts of energy from the pulsed laser unit.

In some implementations, the method can also include using a least-squares curve-fitting process to calculate a threshold value of necessary energy from the single pulse to cause the latchup. This curve-fitting process can also include calculating a slope of the least-squares curve.

The words "device", "circuit", "integrated circuit", "DUT", and "electronic part" are all used interchangeably in this present disclosure and all relate to an electronic component which is the device under test (DUT) for the present disclosure.

Figure 1A:
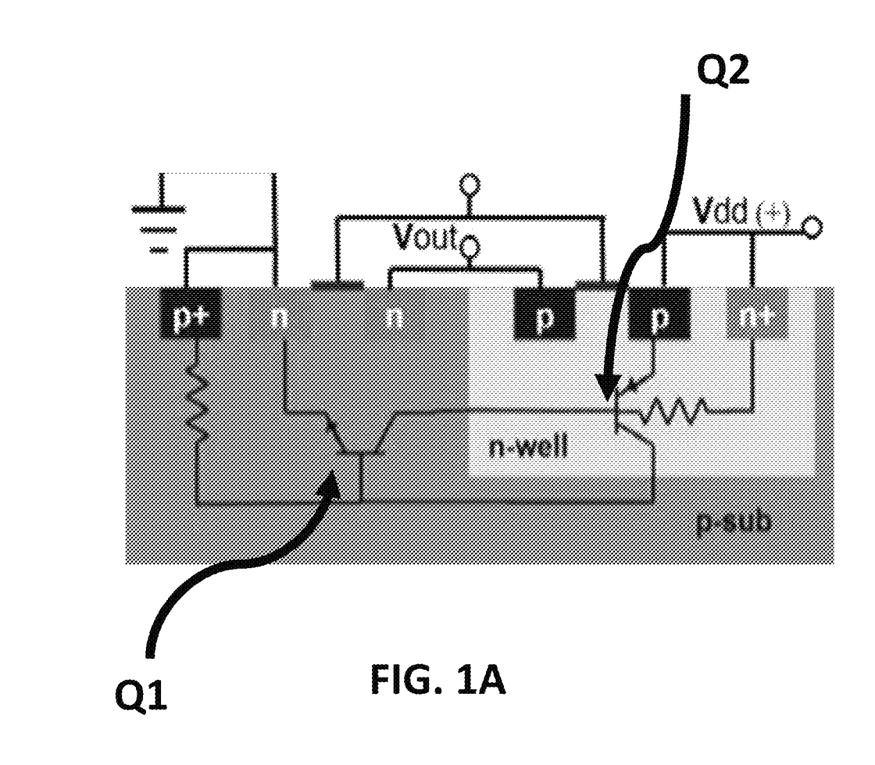
FIG. 1A shows a diagram of parasitic transistor structures in a typical device that can create SELs.
Figure 1B:
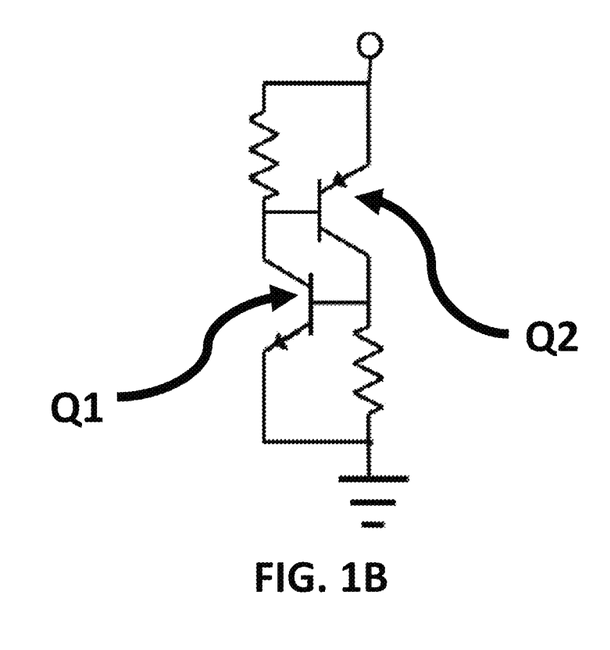
FIG. 1B shows a schematic diagram of an arrangement of a parasitic device.

The words "SEL", "latchup", "latchup event", and "positive feedback event" are all used interchangeably in this present disclosure and all relate to a sustained high-current phenomenon resulting from parasitic thyristor structures, as described further with regards to FIG. 1A and FIG. 1B.

DETAILED DESCRIPTION

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure is directed to a methodology that enables testing of electronic devices with two-photon absorption (TPA) which generates very short laser pulses with intensities on the order of 100's of $GW/cm2$. In this methodology, the laser operates at a frequency of about 1000 Hz. When the laser pulse surpasses a threshold energy, it can cause a SEL on the device. The method of using TPA to test devices only triggers the device in regions of the laser focus where the beam is most intense. This allows the laser to pass through the bulk of the semiconductor without attenuation and produce transients at specific locations. Using very short pulses allows the intensities to be large enough to trigger TPA.

As discussed above, current methods poll the current of a device and turn the device off when a threshold current is achieved. However, this process can take 10s to 100s of milliseconds and significant heating can take place during this time. Additionally, the pulsed laser operates at a frequency of 1000 Hz so that many laser events may take place while the devices is being reset. As a result, it may be difficult to determine which pulse actually caused the SEL.

In view of the limitations of present methods to detect SELs, the present disclosure provides a new circuit called a Detection and Reset Circuit (DARC). In the various examples, the DARC is a microcontroller-based circuit which monitors the current through the device and detects when a SEL occurs. The circuit automatically breaks the current path, causes the device to reset, and then turns the device back on. The detection-mitigation-reset cycle takes place over about 500 microseconds (μs), giving plenty of time for the device to stabilize before the next laser pulse, thus being able to potentially generate SEL at every laser pulse.

Although only particular examples for the DARC are described in the present disclosure, the exemplary examples described below merely constitute examples that do not limit the subject matter of the invention. All the features described above and in the following are advantageous both alone and in any combination with each other.

SEL is a sustained high-current phenomenon resulting from parasitic thyristor structures which are part of the normal complementary metal-oxide-semiconductor (CMOS) fabrication process. CMOS devices contain PNP transistors (Q2), which are formed by the source of the PMOS transistor (emitter), n-well (base) and p-substrate (collector). A NPN transistor (Q1) is formed between the source of the NMOS transistor (emitter), p-substrate (base) and n-well (collector). SEL can be understood as a positive feedback process from the complementary NPN and PNP transistors formed by device wells and junctions, as shown in FIG. 1A. Parasitic resistances are also present and indicated although they are discussed more in detail in regards to FIG. 1B.

A schematic representation of this arrangement of parasitic devices is shown in FIG. 1B. All of these junctions are reverse-biased under normal operating conditions. However, charge introduced into the circuit from a heavy-ion can cause a junction to become forward-biased. If the NPN transistor (Q1) in FIG. 1B begins to conduct, a voltage will be dropped across the n-well resistance. If this voltage exceeds the turn-on voltage for the PNP transistor (Q2), it will begin to conduct. This will cause current to flow in the substrate resistance, causing the NPN transistor (Q1) to turn on even more. This positive feedback loop may cause a damaging amount of current to flow through these devices.

Several conditions must exist for SEL to occur. The first is that the product of the transistor beta values must be greater than 1 for a regenerative path to be maintained. The second is that the supply voltage must be greater than around 1.2V. Thus, circuits operating at 0.9V are usually not susceptible to SEL. However, many such circuits, while having a core running at 0.9V will have interface and I/O circuits operating at 1.2-3.3V and will be susceptible to SEL.

Figure 2:
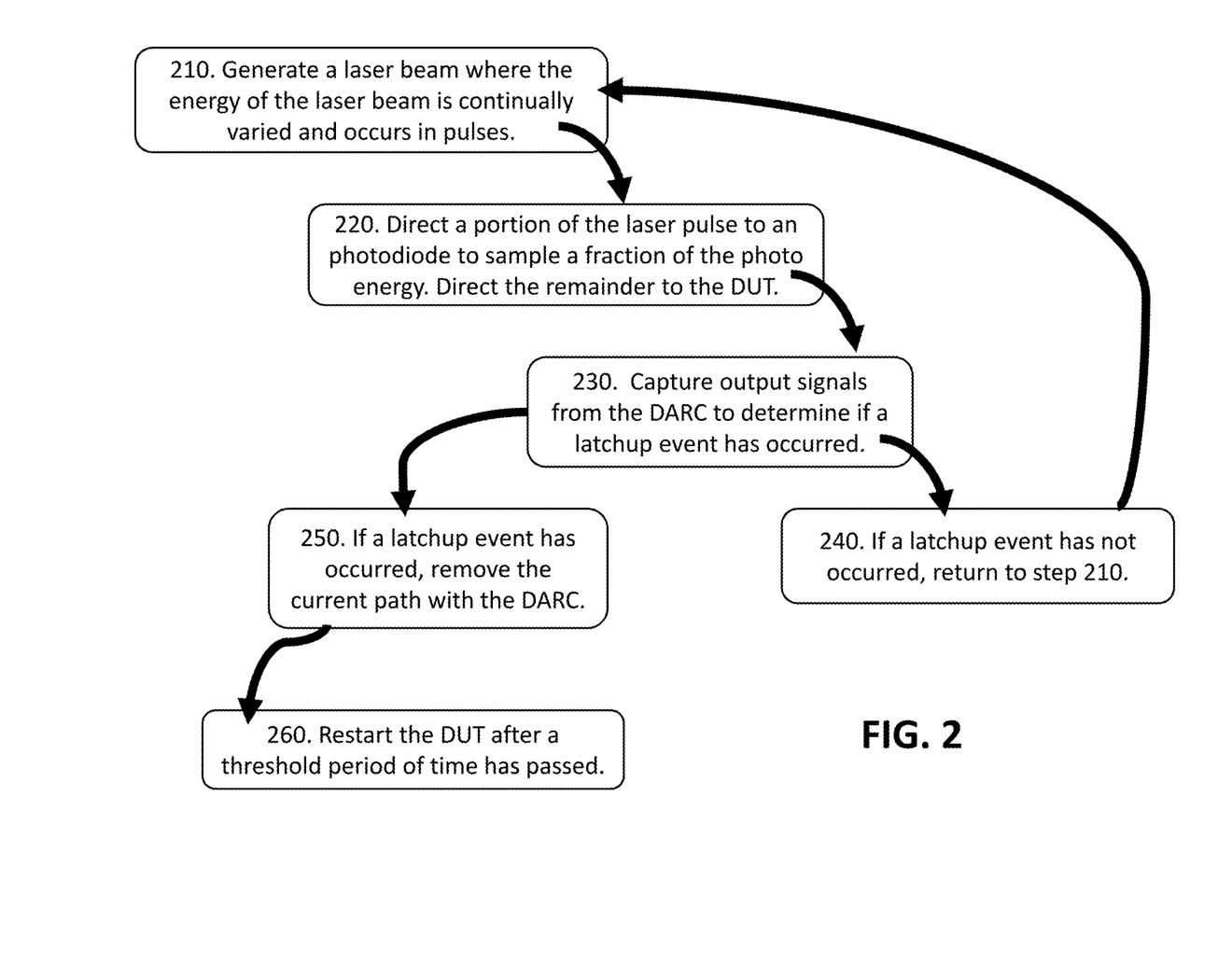
FIG. 2 is a flowchart of the methodology for creating SELs and testing devices according to an exemplary example of the present disclosure.

FIG. 2 is an exemplary flow chart of steps for implementing a methodology according to the present disclosure. In step 210, a laser pulse is generated, where the energy of that laser pulse is continually varied through use of a neutral density filter wheel. As noted above, pulsed lasers can be used to trigger SELs in a manner similar to how SELs are triggered from natural heavy ion radiation in space. The method relies on the non-linear optical technique of two-photon absorption (TPA) where photons are emitted from a laser. The emitted photons have low enough energies that individual photons are not absorbed by a semiconductor. However, multiple photons can interact to generate electron-hole pairs when the laser beam is focused to a very small point and the intensity of the laser beam at that point reaches a certain threshold.

In certain examples, the laser pulses are generated as follows. First, a diode-pumped continuous wave (CW) laser feeds a passively mode-locked oscillator. The mode-locked output is a train of pulses about 150 femtosecond (fs) wide at a repetition rate of about 80 MHz. This output "seeds" a laser-pumped TiS amplifier. The amplifier is Q-switched, producing a high-intensity pulse at a repetition rate of 1 kHz. The output of the amplifier then feeds an optical parametric generator (OPG). The OPG uses nonlinear crystals to mix the input beams with multiples of their respective wavelengths to produce ultrafast pulses at wavelengths from ultraviolet to infrared. This wide range of wavelengths enables generation of photons useful for single and two-photon absorption processes in materials other than silicon.

Thereafter, multiple photon energies leave the OPG. A prism separates the wavelengths and sends the correct wavelength to the turning mirrors. A 1-to-1 telescope with a pinhole located near the focus is used to clean up the beam and remove any structure at the beam edges. The beam then passes through a shutter and can then pass through a linearly graded neutral density filter wheel. The filter wheel is attached to a motor which causes it to act as an energy modulator. The filter wheel varies from transparent to blocking over 99% of the laser energy. The motor rotates at approximately 170 RPM (~2.8 rotations per second). A set of crossed wire-grid polarizers allows manual intensity tuning and is used to set the maximum intensity of the laser pulse.

In step 220, the laser beam is split in order to measure the energy for every pulse. It should be noted that laser energy can vary from pulse to pulse, either from natural variance of the laser pulse or from intentional variance through the filter wheel. After tuning of the laser beam, the laser beam is directed through two beam splitters. The first beam splitter reflects a portion of the beam to a calibrated photodiode for energy measurement. About 1% of the beam can be directed towards the photodiode for measurement. The second beam splitter reflects the remainder of the laser beam to the device under test.

When the laser pulse strikes the photodiode, it produces an electric pulse with an exponential rise and fall time. The peak amplitude of the pulse can be associated with the laser energy. A high-speed oscilloscope can be used to capture the photodiode pulse for every laser pulse.

In step 230, the output signals can be captured from the DARC to determine if a latchup event has occurred. The DARC can directly measure the current output of the device through the use of an amplifier. This current may be monitored on the oscilloscope and correlated with the laser pulse measurements on the photodiode. A high, sustained current is an indication that a latchup has occurred. Additionally, the DARC can provide the microcontroller output that determines the state of the relay used to control current flow through the DUT. When this signal changes from 'high', meaning the relay is closed (conducting current), to 'low' meaning the relay is open (not conducting current), this is an indication that a latchup event has occurred. This signal may be captured on the oscilloscope at the same time as the photodiode pulse. If the output stays high after a laser pulse, no latchup has occurred. If this output goes low following a laser pulse, a latchup event has been detected and is being mitigated.

In certain examples, the output signals are captured with an oscilloscope that uses a high-speed capture mode to record the pulses and a controlling computer downloads the data and stores them in a file. One file is created for each location on the DUT and a heat map of the SEL sensitivity of the DUT can be generated (discussed further with regards to FIG. 8).

In step 240, if the DARC has not detected a SEL, then the method returns to step 210 and the energy of the laser beam is varied to create another laser pulse.

In step 250, if a latchup event has occurred, then the DARC removes the current path of the DUT. Particular examples of this step are discussed further with regards to FIG. 4. The current path is broken by using a relay in a series connection with the DUT. By changing the state of the relay from "closed" to "open", the current path will be broken and no more current will flow through the device.

In step 260, the DUT is reset and restarted after a threshold period of time has passed. The DUT is reset so that the current flowing in the parasitic transistors is broken and so that the current path will start and continue in the originally intended pathway when the device is restarted. The threshold period of time should be sufficiently long enough for the device to stabilize before the next laser pulse. Thus, the device could potentially generate SEL at every laser pulse.

Figure 3:
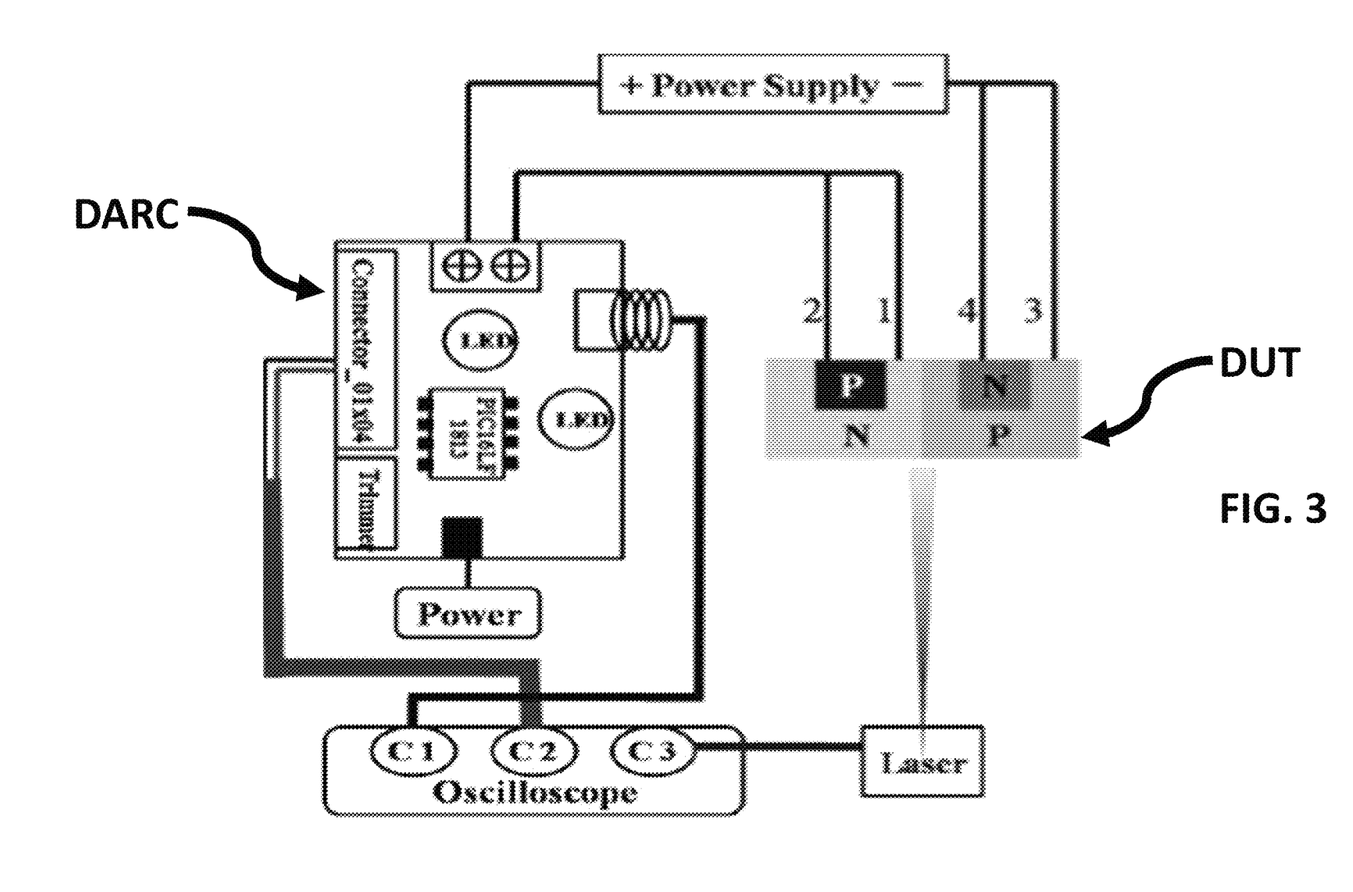
FIG. 3 shows a schematic diagram of how a test device is connected to a detection circuit, an oscilloscope, a power source, and a laser, according to an exemplary example of the present disclosure.

FIG. 3 shows schematically how the test device is connected to the detection circuit. The detection circuit is connected in series with the DUT while the outputs are monitored on the oscilloscope. The diagram shows the connections between the DUT, oscilloscope, and the DARC, laser source, and the power supply. The laser source emits a laser pulse directed at the DUT. A small percentage of the laser pulse is directed to the oscilloscope which measures the energy of the laser pulse. The DUT receives the majority of the laser pulse and can experience a resultant SEL if the energy from the laser pulse surpasses a threshold energy of the particular area of the DUT which received the laser pulse. The DUT is connected to a power supply which enables the DUT to be in operation as if it were actually being operated as an electronic component. Both the DUT and the power supply are connected to the DARC. The DARC monitors the current flow through the DUT and can shut off the current path to the power supply when an SEL is triggered on the DUT. C1 and C2 are the inputs to the oscilloscope and are used to monitor the relay control signal and current monitor signal generated by the DARC, as described in the discussion on step 230 in FIG. 2.

Figure 4:
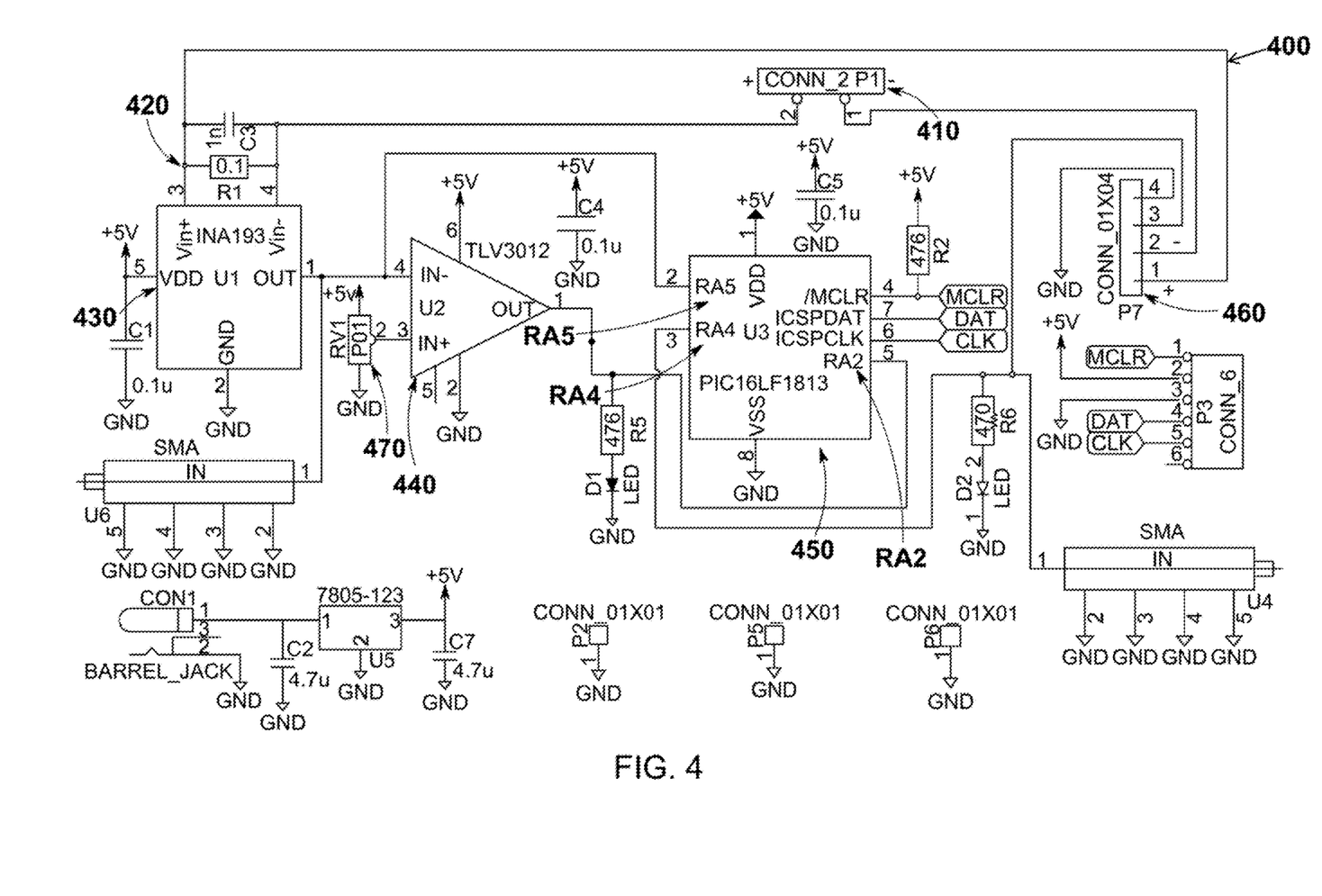
FIG. 4 shows a schematic design of a circuit according to an exemplary example of the present disclosure for monitoring a current through a device, detecting a latchup event, and automatically removing the latchup current path, according to an exemplary example of the present disclosure.

FIG. 4 shows a system 400 which includes a connector 410; a solid-state relay 460; a current sense resistor 420; an amplifier 430; a comparator 440; a microcontroller 450; a general purpose digital input RA2; output of the microcontroller RA4; a general purpose analog input RA5; and a variable resistor divider 470.

The DARC is connected in series with the power supply through the connector 410. The current flows through a solid-state relay 460 and a current sense resistor 420. A voltage is developed across the current sense resistor 420 proportional to the current through the device and is fed into an amplifier 430. The amplifier 430 can be a fixed-gain instrumentation amplifier designed for current sensing applications.

The output of the amplifier 430 goes into the inverting input of a comparator 440, as well as a general purpose analog input RA5 on the microcontroller 450. The non-inverting input of the comparator 440 is connected to a potentiometer connected as a variable resistor divider 470. The voltage at the non-inverting input is used to set the threshold current for detecting a latchup event. When the current through the current sense resistor 420 causes the voltage output of the amplifier 430 to be less than the voltage on the non-inverting input of the comparator 440, the output of the comparator 440 will be high and can approach 5V. When a latchup event occurs, the current through the current sense resistor 420 will cause an increase in the output of the amplifier 430. If this voltage is higher than the value set by a voltage reference (shown as a resistor divider 470), the output of the comparator 440 will go low, approaching 0V.

The microcontroller 450 can detect latchup events two ways. A general purpose analog RA5 allows the microcontroller 450 to directly measure the voltage output of 430. The output of the comparator 440 is also fed into the microcontroller 450 through a general purpose digital input RA2. The RA4 output of the microcontroller 450 is configured as a digital output and controls the solid-state relay 460 through which the current in the device flows. Normally, this output is high causing the solid-state relay 460 to be 'on'. When the microcontroller 450, by analyzing its inputs, determines a latchup event has occurred, the output of the microcontroller RA4 is driven low. This causes the solid-state relay 460 to open, breaking the current path through the device and mitigating the latchup event.

EXPERIMENTAL RESULTS

Figure 5:
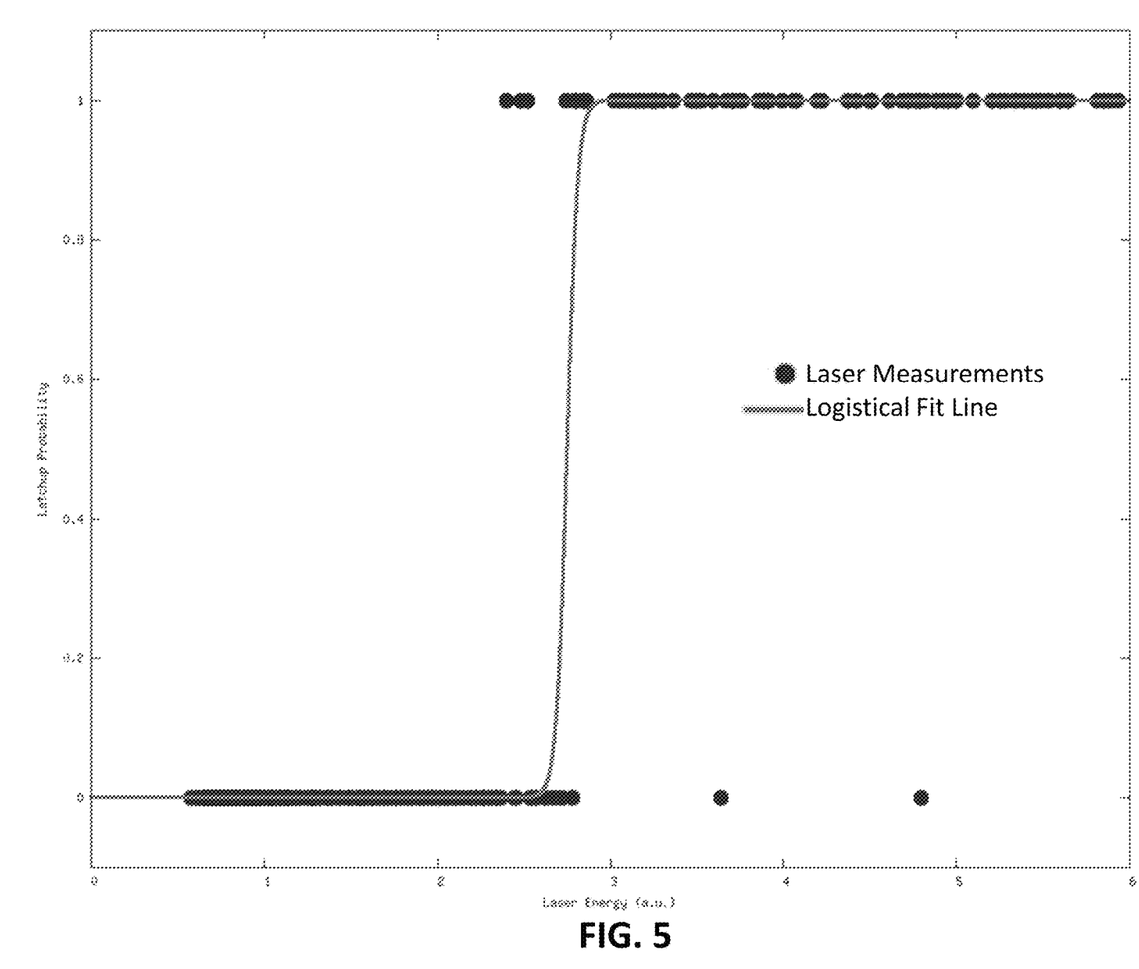
FIG. 5 is an X-Y plot of a statistical analysis of the pulse variation to determine the threshold energy that will cause an SEL.

The data analysis aims to find the threshold laser energy required to cause SEL. Areas of higher sensitivity will exhibit lower thresholds and less sensitive areas will have higher thresholds. Normally this would be a straightforward operation consisting of finding the highest energy that does not cause a SEL and the lowest energy that causes SEL. In an ideal situation, the latchup energy should be higher than the no-latchup energy and an average of the latchup energy and the no-latchup energy would estimate the threshold. However, due to physical mechanism still under investigation, some portions of the device show considerable overlap in energy between the pulses that cause latchup and do not cause latchup. This increases the difficulty in determining a threshold. An example of this is shown in FIG. 5 where laser measurements are indicated by circles and latchups occur when the probability of the latchup is 1.

To solve this problem, the present disclosure performs a least-squares fit to a function which can describe the probability of a SEL at a given energy. The function can be symmetric and can approximate a step function. A logistic function can be a viable fit to the data where the threshold is defined as the energy where the function equals ½. The logistic function is defined as $$f(x) = \frac{1}{1+e^{-k(x-x_0)}}.$$

The function only has two parameters, $x_0$, the center or threshold value, and k, the shape parameter. For cases where there is no overlap, the fit approaches a step function with a very steep slope at the threshold, or high k. When there is overlap, the slope is less steep. FIG. 5 shows a logistic fit line to sample laser latchup data, with a threshold $x_0$ of 2.75 and a k value of 32.6.

Figures 6A, 6B:
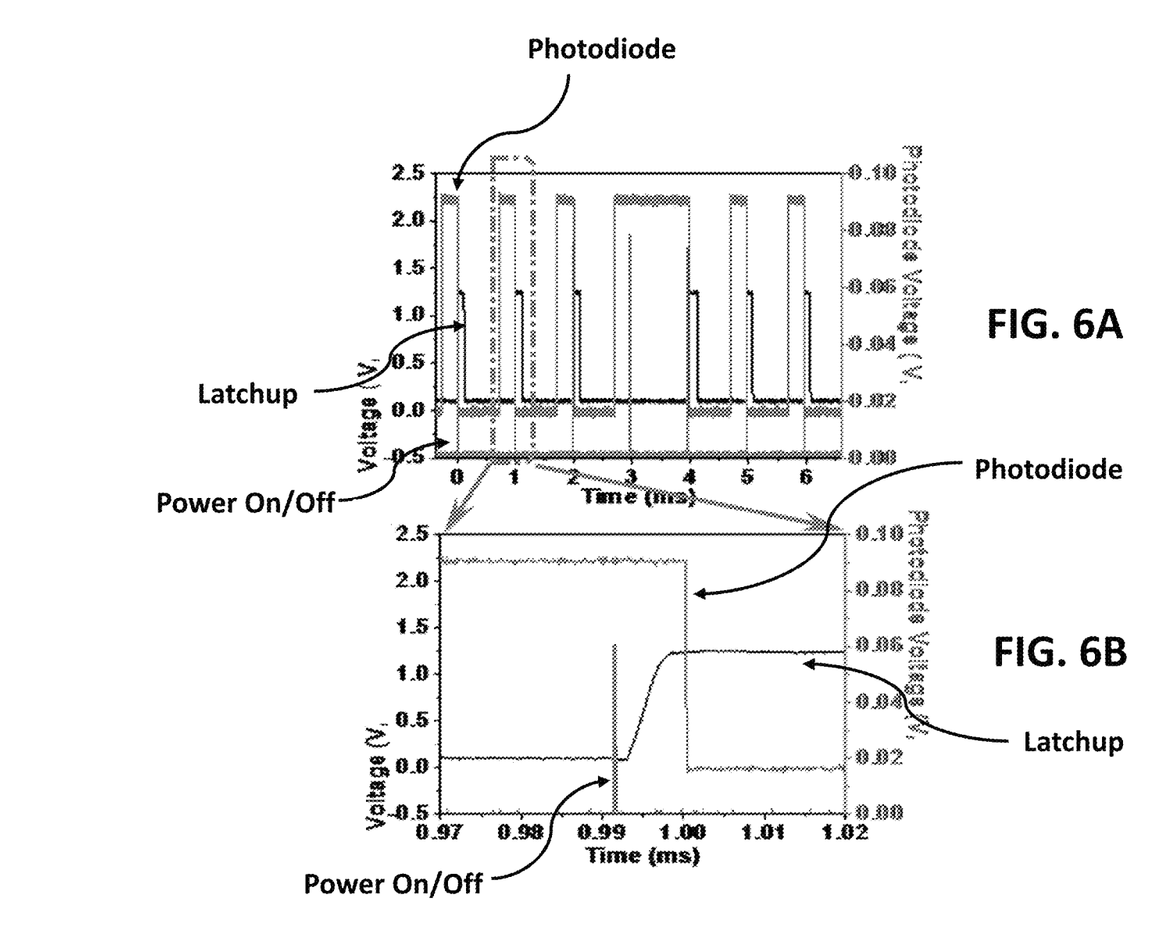
FIG. 6A is an X-Y plot of time versus voltage for a series of laser pulses.
FIG. 6B is an X-Y plot of time versus voltage for a laser pulse which triggered a latchup event.

FIG. 6A shows the data recorded in a typical latchup event. FIG. 6A and FIG. 6B show the energy on the photodiode, the voltage from the current monitoring amplifier which identifies latchup events, and the on-off signal from the microcontroller to the relay. FIG. 6A shows six laser pulses that cause latchup and one that does not. There is one millisecond between each event. This means that the system is operating at the repetition rate of the laser. The system is able to detect and reset events at a rate to allow each laser pulse the opportunity to cause a latchup. It can be seen on the expanded view in FIG. 6B that after the laser pulse there is a delay before the latchup current starts to rise. The delay and rise-time of the latchup current is mostly a function of the time and slow response of the amplifier. The actual latchup current will rise much faster. After a short time, the microcontroller removes power to relay.

Figure 7:
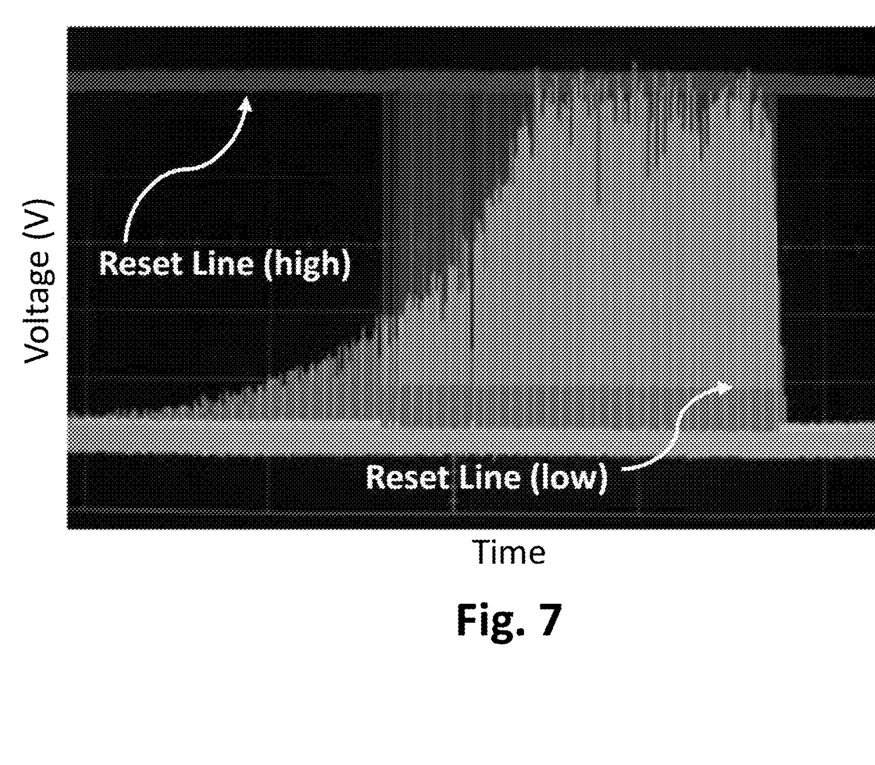
FIG. 7 is a graph showing laser pulse energies and resent signals.

FIG. 7 shows 400 laser pulses with a modulated energy. This provides a view of a typical scope capture when using an energy modulator to strike the device with a range of energies as a way to determine the onset energy for latchup. For lower laser energies, which are represented by thicker lines producing a curved shape, the reset line stays high, since no latchup occurs. At higher energies, the latchup events cause the reset line to go low. Due to slight variations with each pulse, there is a probability that a pulse near the threshold may or may not cause a latchup.

Figure 8:
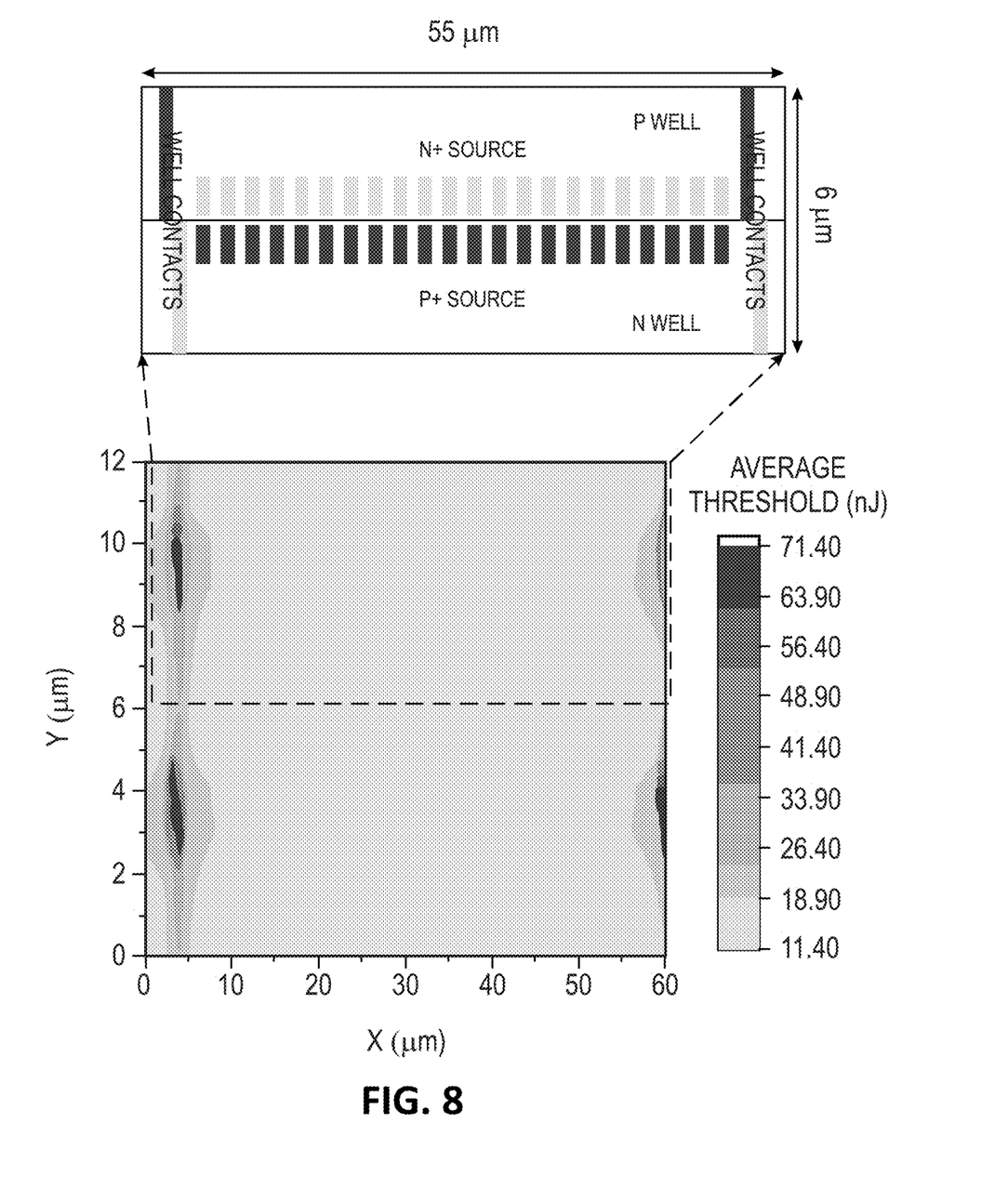
FIG. 8 is a heat map showing the sensitivity of a row of test structures.

FIG. 8 shows an exemplary sensitivity map, also referred to as a heat map, of a DUT created after analyzing the threshold energy to create an SEL at each location. Laser pulses with modulated energy are repeated over the area of interest on the part. Control software can be used to coordinate the positioning and data-collection processes. Automated software routines can analyze the data for all energies at each position. The map shows that the energy required to cause a latchup increases significantly near the well contacts, as expected from device analysis.

The sensitive area can be estimated by using standard numerical techniques to sum the area where the SEL latchup is below a specified threshold. The SEL-sensitive area is a useful metric for comparing similar devices, as the SEL rate will be proportional to this value. The actual SEL rate cannot be fully computed without mapping the laser energy and heavy-ion linear energy transfer.

Figure 9:
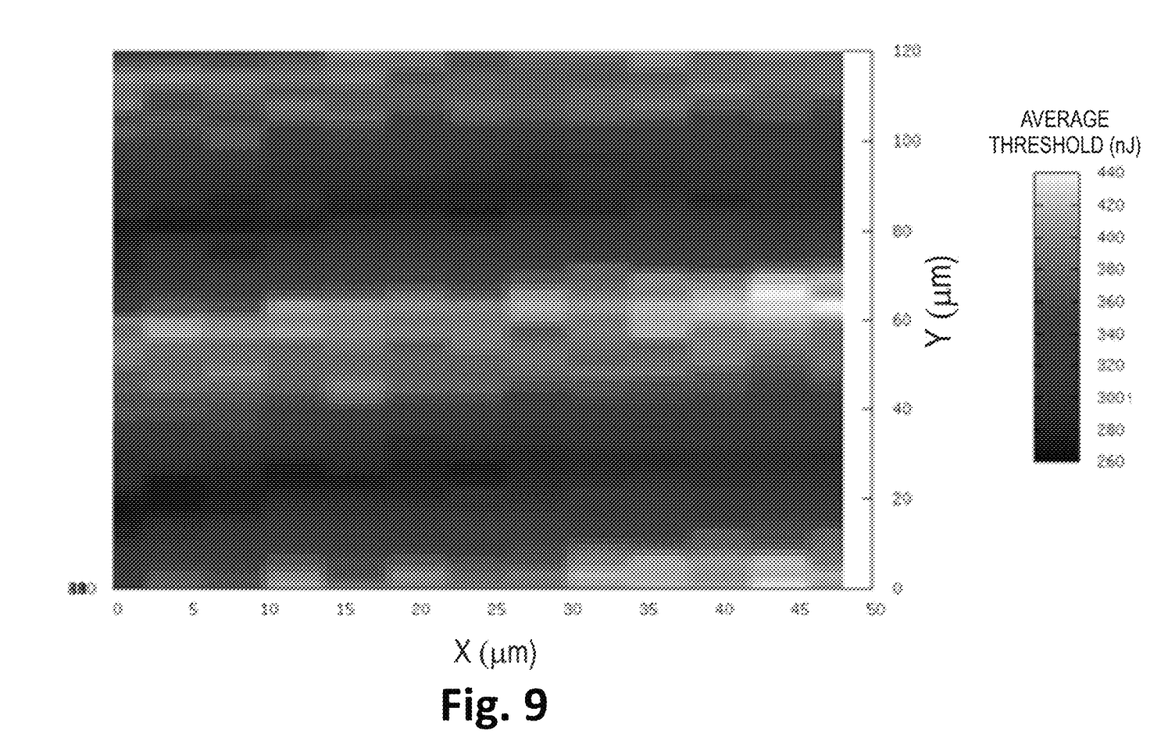
FIG. 9 is a heat map of sensitivity of a device using information of the threshold energy for a latchup event.

FIG. 9 provides another heat map of the SEL sensitivity of a DUT. The sensitive area for FIG. 9 is calculated in the same manner as the sensitive area for FIG. 8.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A method for detecting latchups comprising:
applying, via a pulsed laser unit, a series of laser pulses to a testing object which is connected to a testing circuit and powered on through a power supply;
measuring an energy of each of the series of laser pulses;
for each pulse of the series of laser pulses:
detecting, via a detection unit of the testing circuit, whether a pulse of the series of laser pulses resulted in a latchup on the testing object,
logging the energy of each of the series of laser pulses and a latchup status of each of the series of laser pulses using a recording unit,
if a latchup has been detected, automatically removing a current path of the testing object,
powering on, after a pre-determined period of time, the testing object by the detection unit, and
determining a threshold energy by calculating a fit to a logistic function using the logged energy and latch-up status of each of a plurality of pulses of the series of laser pulses.

2. The method of claim 1, further comprising:
continuously varying energy from the pulsed laser unit with a filtering unit.

3. The method of claim 2, wherein the filtering unit is configured to be a neutral density filter wheel on a motorized mount which rotates continuously to allow for a different energy of the pulsed laser unit every millisecond.

4. The method of claim 1, wherein the detection unit is configured to be a circuit connected in series with the testing object and wherein the detection unit can measure both analog and digital signals to determine whether the latchup has occurred.

5. The method of claim 1, wherein the detection unit and the recording unit are combined to be a detection and recording circuit.

6. The method of claim 1, wherein the pre-determined period of time is a period of time exceeding a period of time the testing object uses to return to a neutral state after receiving elevated amounts of energy from the pulsed laser unit.

7. A system for detecting latchups comprising:
a testing object;
a power supply configured to power on the testing object;
a pulsed laser unit configured to apply a series of laser pulses to the testing object;
a testing circuit connected to the testing object and configured to measure an energy of each of the series of laser pulses, the testing circuit comprising:
a detection unit, wherein the detection unit is configured to detect, for each pulse of the series of laser pulses, whether a pulse of the series of laser pulses resulted in a latchup on the testing object; and
a recording unit configured to log the energy of each of the series of laser pulses and a latchup status;
wherein the testing circuit is additionally configured to automatically remove a current path of the testing object if a latchup has been detected,
power on, after a pre-determined period of time, the testing object by the detection unit, and determine a threshold energy by calculating a fit to a logistic function using the logged energy and latch-up status of each of a plurality of pulses of the series of laser pulses.

8. The system of claim 7, wherein the pulsed laser unit is further configured to continuously vary energy from the pulsed laser unit with a filtering unit.

9. The system of claim 8, wherein the filtering unit is configured to be a neutral density filter wheel on a motorized mount which rotates continuously to allow for a different energy of the pulsed laser unit every millisecond.

10. The system of claim 7, wherein the detection unit is configured to be a circuit connected in series with the testing object and wherein the detection unit can measure both analog and digital signals to determine whether the latchup has occurred.

11. The system of claim 7, wherein the detection unit and the recording unit are combined to be a detection and recording circuit.

12. The system of claim 7, wherein the pre-determined period of time is a period of time exceeding a period of time the testing object uses to return to a neutral state after receiving elevated amounts of energy from the pulsed laser unit.

* * * * *